United States Patent
Rajagopalan et al.

(10) Patent No.: US 10,292,246 B2
(45) Date of Patent: May 14, 2019

(54) AREA ILLUMINATION SYSTEM AND METHOD

(71) Applicant: SIGNIFY HOLDING B.V., Eindhoven (NL)

(72) Inventors: Ruben Rajagopalan, Eindhoven (NL); Harry Broers, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/567,096

(22) PCT Filed: Apr. 20, 2016

(86) PCT No.: PCT/EP2016/058744
§ 371 (c)(1),
(2) Date: Oct. 17, 2017

(87) PCT Pub. No.: WO2016/173897
PCT Pub. Date: Nov. 3, 2016

(65) Prior Publication Data
US 2018/0168016 A1    Jun. 14, 2018

(30) Foreign Application Priority Data
Apr. 28, 2015  (EP) .................................. 15165467

(51) Int. Cl.
*F21V 21/14* (2006.01)
*G06F 17/50* (2006.01)
*H05B 37/02* (2006.01)

(52) U.S. Cl.
CPC .......... *H05B 37/029* (2013.01); *F21V 21/14* (2013.01); *G06F 17/5004* (2013.01)

(58) Field of Classification Search
None
See application file for complete search history.

(56) References Cited

U.S. PATENT DOCUMENTS

| | | | |
|---|---|---|---|
| 4,450,507 A | 5/1984 | Gordin | |
| 8,300,219 B1 | 10/2012 | Gordin et al. | |
| 9,677,755 B1 * | 6/2017 | Linnell | ............... F21V 33/0052 |

(Continued)

FOREIGN PATENT DOCUMENTS

WO     2006078696 A2    7/2006

*Primary Examiner* — Ryan A Jarrett

(57) ABSTRACT

Disclosed is an illumination system (100) and method (600) for generating a predefined illumination pattern on an area (10). The system comprises a plurality of luminaires (110), each luminaire having an orientation adjustment mechanism and being arranged to generate a contribution (210, 210') to said illumination pattern on a part of said area; a plurality of cameras (120), each camera associated with one of said luminaires for capturing an image of an illuminated part of said area including the contribution generated by said associated luminaire; and a control unit (130) adapted to facilitate the generation of the predefined illumination pattern by evaluating one of said images to determine a deviation from the predefined illumination pattern for the illuminated part of said area captured in said image; selecting a luminaire from said plurality of luminaires from information contained in a light plan and generating an orientation adjustment signal for the selected luminaire based on the determined deviation.

15 Claims, 5 Drawing Sheets

(56) References Cited

U.S. PATENT DOCUMENTS

| | | |
|---|---|---|
| 2006/0198145 A1 | 9/2006 | Gordin |
| 2012/0134155 A1 | 5/2012 | Wendt et al. |
| 2013/0268246 A1 | 10/2013 | Gordin |
| 2013/0293722 A1 | 11/2013 | Chen |
| 2013/0310652 A1 | 11/2013 | Barsoum et al. |
| 2017/0205061 A1* | 7/2017 | Broers ............... H05B 37/0227 |
| 2018/0144213 A1* | 5/2018 | Nieuwlands ............. G06T 7/74 |

* cited by examiner

AREA ILLUMINATION SYSTEM AND METHOD

CROSS-REFERENCE TO PRIOR APPLICATIONS

This application is the U.S. National Phase application under 35 U.S.C. § 371 of International Application No. PCT/EP2016/058744, filed on Apr. 20, 2016 which claims the benefit of European Patent Application No. 15165467.0, filed on Apr. 28, 2015. These applications are hereby incorporated by reference herein.

FIELD OF THE INVENTION

The present invention relates to an illumination system for generating a predefined illumination pattern on an area of a given size.

The present invention further relates to a method for generating a predefined illumination pattern on an area of a given size.

BACKGROUND OF THE INVENTION

Many high-end lighting applications require a plurality of luminaires aimed at an area of given size to generate a predefined illumination pattern on the area. Examples of such applications include arena lighting systems for illuminating sports arenas, e.g. field, pitch or stadium lighting, façade lighting, shop floor lighting, parking lot lighting and so on. The desired predefined illumination pattern may be a uniform or homogenous lighting pattern.

A light designer may be employed to create a so-called lighting plan for the area to be illuminated, in which the light designer determines the mounting positions of the luminaires relative to the area to be illuminated and the aiming information for the luminaires, e.g. in which orientation the luminaires are to be mounted such that the luminaires can cooperate to generate the predefined illumination pattern. The light plan may contain, for each luminaire, information such as the type of luminaire, the mounting location and orientation of the luminaire, and the aiming location or point, e.g. relative to the centre of the area to be illuminated. For example, a football stadium may have a lighting plan or design where the lighting system contains more than 100 luminaires each located on the stadium and with a desired aiming location or point on the pitch to attempt to provide a suitable lighting effect. The light designer may create such a light plan remotely, e.g. by employing illumination simulations for the area to be illuminated, which simulations may yield the light plan to be implemented.

Such a light plan is typically used by an illumination system installer to install the luminaires in their relative positions and to aim the luminaires in accordance with the provided aiming information. This however is not without problems. For example, the installer may have difficulty in correctly aiming the luminaires, for instance because of a lack of a clear reference on the area to aim at. From the luminaire location, the installer has a clear overview of the field but it is very difficult to accurately determine the aiming location in the field.

To improve the accuracy of the alignment procedure, the installer can use a grid created by manually putting visual markers on the area to be illuminated at the required coordinates and a laser pointer aligned with the luminaire optical axis. In such a way the alignment is a matter of aiming the laser spot at the requested visually interpolated locations on the grid. However, the placement of the visual markers on the area is an elaborate task and the alignment itself based on the laser spot is prone to errors. Moreover, such a procedure is less suitable for vertical areas, e.g. façades. In addition, the installer may find that a particular luminaire cannot be aimed at the desired area location because of an obstacle in the light path of the luminaire that the light designer was unaware of when (remotely) deciding the mounting positions for the luminaire or because the intended mounting location of the luminaire is unavailable, in which case the installer usually mounts the luminaire in the nearest available location. In this scenario, the provided light plan is imperfect such that the installer cannot achieve the predefined illumination pattern even when perfectly implementing the provided light plan.

These problems can lead to the resulting actual illumination pattern on the area deviating from the predefined illumination pattern, e.g. containing excessive inhomogeneities, such that some adjustment of the luminaire arrangement is required.

US published application US 2013/0268246 suggests to attach a camera to the luminaire so that the installer is able to 'see' where the light from the luminaire will be directed by producing a 'cropped' image reflecting the modelled light pattern. This cropped image can then be compared with a further 'wide-angle' camera image to determine the location of the light beam and pattern relative to a wide-angle image and so determine whether the luminaire is directed at the required direction. Although this can improve the aiming accuracy of the luminaire installation, it for instance does not assist the installer when encountering obstacles in the light path of the luminaires.

SUMMARY OF THE INVENTION

The present invention seeks to provide an illumination system for generating a predefined illumination pattern on an area without having to rely on the correct implementation of an accurate light plan.

The present invention further seeks to provide a method of generating a predefined illumination pattern on an area without having to rely on the correct implementation of an accurate light plan.

According to an aspect, there is provided an illumination system for generating a predefined illumination pattern on an area, the system comprising a plurality of luminaires, each luminaire having an orientation adjustment mechanism and being arranged to generate a contribution to said illumination pattern on a part of said area; a plurality of cameras, each camera associated with one of said luminaires for capturing an image of an illuminated part of said area including the contribution generated by said associated luminaire; a data storage device storing a light plan including positional information and aiming information for each luminaire; and a control unit adapted to facilitate the generation of the predefined illumination pattern by evaluating one of said images to determine a deviation from the predefined illumination pattern for the illuminated part of said area captured in said image; selecting a luminaire from said plurality of luminaires based on information in said light plan; and generating an orientation adjustment signal for the selected luminaire based on the determined deviation.

The present invention is based on the insight that the optical feedback provided by the cameras associated with the luminaires can be used to control the luminaire orientation by evaluating the captured images to extract information regarding the actual illumination pattern of the area or part thereof from the image data and to generate an orientation adjustment signal for selected luminaires based on this information that is used to control the orientation adjustment mechanism of the selected luminaire. In this manner, a feedback loop can be implemented in which the orientations of the luminaires may be adjusted until the predefined illumination pattern has been established on the area of given size. The optical feedback provided by the cameras may be used to correct imperfections in the light plan or installation thereof.

In a preferred embodiment, the orientation adjustment mechanism is an electronically controllable orientation adjustment mechanism, and wherein the orientation adjustment signal is for controlling the electronically controllable orientation adjustment mechanism. This has the advantage that the luminaires may be automatically adjusted without installer intervention.

The control unit may be further adapted to select a first luminaire of said plurality and generate the orientation adjustment signal for the first luminaire to align the contribution to the illumination pattern generated by the first luminaire with a reference point on said area based on the image captured by the camera associated with the first luminaire; and repeatedly select a subsequent luminaire of said plurality and generate the orientation adjustment signal for the subsequent luminaire to align the contribution to the illumination pattern generated by the subsequent luminaire with a contribution to the illumination pattern generated by a previously selected luminaire based on the image captured by at least one of the camera associated with the subsequent luminaire and the camera associated with the previously selected luminaire until the predefined illumination pattern has been established.

The illumination system may further comprise a plurality of further cameras for positioning along different viewing angles of the area, each of the further cameras being arranged to capture a further image of at least a part of the illumination pattern along said viewing angle, wherein the control unit is adapted to generate the predefined illumination pattern by selecting individual luminaires and generate the orientation adjustment signal for a selected luminaire in response to illumination pattern information extracted from an image captured by a camera arranged to capture an image of at least a part of the contribution to the illumination pattern generated by the selected luminaire and illumination pattern information extracted from respective images captured by the further cameras. This may ensure that the desired illumination pattern, e.g. a homogeneous or uniform illumination pattern is achieved from multiple viewing angles of the area. This is for instance of particular relevance if the area is a pitch of a sports arena, where it is desirable that the pitch is homogeneously illuminated from different viewing angles, e.g. different camera positions from which broadcasting images are captured.

The control unit may be adapted to iteratively receive and evaluate an updated image of said illuminated part for determining an updated deviation from the predefined illumination pattern following an orientation adjustment of the selected luminaire; and generate a further orientation adjustment signal for the selected luminaire in order to reduce the updated deviation until said updated deviation falls below a predefined deviation threshold or until the number of iterations exceeds a predefined iteration threshold.

The system may further comprising a data storage device storing association information identifying each luminaire associated with a particular camera, wherein the control unit is adapted to select the luminaire associated with the determined deviation based on the information contained in the light plan and the association information. This allows for the selection of luminaires based on predetermined position information as well as actual optical feedback. This for instance may be desirable where not every luminaire is associated with a camera, which may be feasible if the cameras are capable of capturing a plurality of contributions in a single image.

The light plan may further contain orientation information for each luminaire, e.g. X, Y, Z coordinates, and wherein the control unit is adapted to generate the orientation adjustment signal for the selected luminaire from its orientation information in the light plan and to optionally update the orientation information of the selected luminaire in accordance with the generated orientation adjustment signal.

In an embodiment, the control unit is further adapted to adjust the intensity of the contribution to the illumination pattern generated by the selected luminaire to achieve the predefined illumination pattern. By adjusting both the orientation of the luminaires and the intensity of their respective contributions, the predefined illumination pattern can be more easily achieved.

Each luminaire may have a camera mounted on the luminaire, wherein a field of view of said camera is aligned with a direction in which the associated luminaire generates its contribution. This provides particularly reliable optical feedback to the control unit. Alternatively, each camera may be associated with more than one luminaire, e.g. placed such that it can capture the luminous distributions of multiple luminaires.

The illuminated part of the given area may be illuminated by a plurality of said contributions, wherein said contributions are partially overlapping in said predefined illumination pattern. In such an arrangement, the control unit may readily establish deviations from the predefined illumination pattern by evaluating of the overlap between adjacent contributions.

In an embodiment, the control unit employs an algorithm for evaluating a luminous distribution captured in said image; and comparing the evaluated luminous distribution with an intended luminous distribution of the predefined illumination pattern, wherein the control unit is adapted to generate the orientation adjustment signal based on said comparison.

Embodiments of the present invention are particularly advantageous where the given area is a pitch of a sports arena such as a stadium. However, the present invention is not limited to such given areas; it is equally feasible that the given area for instance is a building façade, a floor area of a commercial building or a parking area.

The predefined illumination pattern preferably is a homogeneous illumination pattern although the present invention is not limited thereto.

According to another aspect, there is provided a computer-implemented method for generating a predefined illumination pattern on an area with a plurality of luminaires each comprising an adjustable orientation mechanism and being arranged to generate a contribution to said illumination pattern on a part of said area, the method comprising repeating the steps of evaluating one of said images to determine a deviation from the predefined illumination pattern for the illuminated part of said area captured in said image; selecting a luminaire from said plurality of luminaires based on information in a light plan including positional information and aiming information for each luminaire; and generating an orientation adjustment signal for the selected luminaire based on the determined deviation until the predefined illumination pattern has been generated. In this manner, a predefined illumination pattern may be achieved in an iterative manner using optical feedback provided by cameras arranged to capture the contributions to the illumination pattern by the respective luminaires in order to correct imperfections in the light-plan based generation of a luminous pattern by the luminaires.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
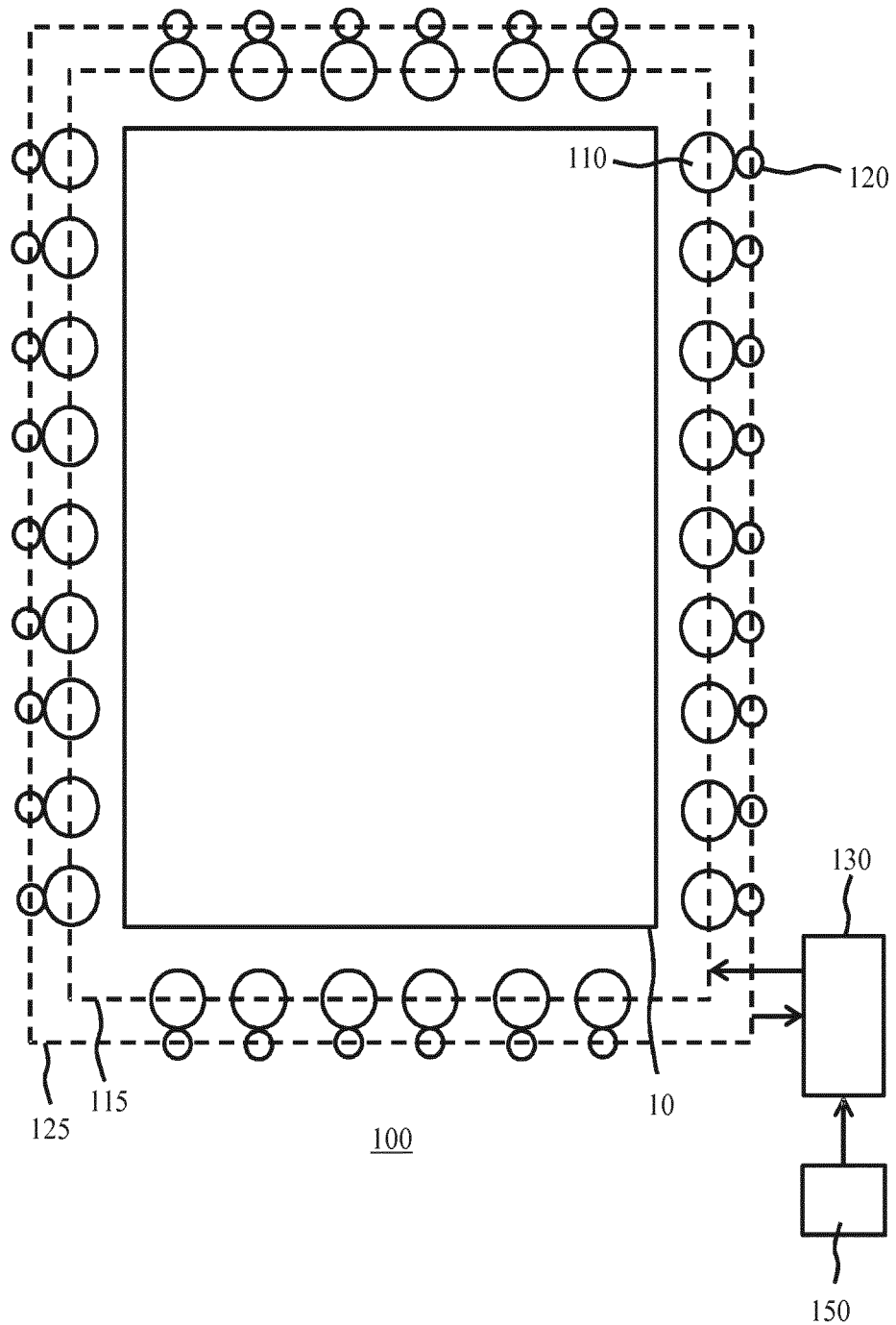
FIG. 1 schematically depicts an illumination system according to an embodiment.

It should be understood that the Figures are merely schematic and are not drawn to scale. It should also be understood that the same reference numerals are used throughout the Figures to indicate the same or similar parts.

Embodiments of the present invention relate to an illumination system for illuminating an area of given size, i.e. an area having known dimensions. Such dimensions for instance may be provided as input parameters or in any other suitable form to the system. The illumination system is typically to be arranged to generate a predefined illumination pattern onto the area of given size. In at least some embodiments, the predefined illumination pattern is a homogeneous or uniform illumination pattern. In at least some other embodiment, the predefined illumination pattern is a non-homogeneous or non-uniform illumination pattern. In the context of the present application, a homogeneous or uniform illumination pattern is an illumination pattern in which across the area to be illuminated variations in the illumination intensity produced by the luminaires of the system are below a predefined threshold. By way of non-limiting example, the peak intensity in any region of the area to be illuminated is no more than three times the minimum intensity in any (other) region of the area to be illuminated. It should be understood that other ratios or other definitions expressing a uniform or homogeneous illumination of the area of given size are equally feasible.

In at least some embodiments, the area to be illuminated is an area on which a sport is practiced, such as a pitch, pool, velodrome or any other suitable area. The area to be illuminated may form part of a sports arena, in which the area to be illuminated typically is surrounded by a spectator area, e.g. seating areas, stands, and so on. However, it is emphasized that the present invention is not limited to the illumination of sports arenas; it is equally feasible that the area of given size to be illuminated is another type of large area such as a façade of a building, where for example façade illumination may be desirable for aesthetic reasons, a floor area of a commercial building such as a shop floor, a warehouse floor or the floor area of a parking lot, where the illumination system may be used to generate a predefined illumination pattern for functional reasons, e.g. to facilitate the commercial activities performed on the area of given size in a desirable, e.g. safe, manner.

FIG. 1 schematically depicts an illumination system 100 for generating a predefined illumination pattern on an area 10 of a given size, here a pitch of a sports arena by way of non-limiting example. The illumination system 100 comprises a plurality of luminaires 110 for mounting relative to the area 10 such that the luminaires 110 can be aimed at the area 10 in order to generate the predefined illumination pattern. For example, in case of a sports arena, the luminaires 110 may be mounted around the area 10, i.e. around the pitch, in order to achieve the predefined illumination pattern. For example, the luminaires 110 may be mounted in dedicated mounting frames to be positioned in selected positions of the sports arena, e.g. in proximity corners of the area 10, in which case each mounting frame may include a mast for elevating the mounting frame to a desired height in order to achieve pitch illumination under suitable illumination angles. A particularly common arrangement is where the luminaires 110 are mounted on the stands and seating areas around the area 10, wherein the luminaires 110 may be mounted on different tiers of the spectator areas to achieve pitch illumination under a range of illumination angles. This for instance is advantageous when trying to achieve uniform or homogeneous illumination of a pitch region under different viewing angles, e.g. from different camera positions for capturing sports action on the area 10 for broadcasting purposes, where the illumination requirements may be more easily achieved when illuminating a pitch region from multiple illumination angles.

However, it will be understood that where the illumination system 100 is arranged to illuminate a different type of area 10 as previously explained, the luminaires 110 may be mounted in different relative positions with respect to the area 10 to be illuminated; for instance, in case of the area 10 being the façade of the building, the luminaires 110 may be mounted opposite the area 10, in case of the area 10 being a floor area of a commercial building or parking lot, the luminaires 110 may be mounted above the area 10, and so on.

The luminaires 110 or their mounting typically comprise an orientation adjustment mechanism that allows for the adjustment of the aim of a luminaire 110, such that the luminaire 110 can be aimed at a different part of the area 10. For example, the luminaire 110 may be mounted using a suitable mounting point or jig configured to be adjustable in order to change the orientation of the luminaire 110. This adjustment in some embodiments is a two dimensional adjustment. Suitable adjustments can be any two or three of the following: an orientation around a horizontal axis (a tilt adjustment); an orientation around a vertical axis (a pan adjustment); and an orientation around the optical axis of the luminaire (a roll adjustment). The orientation adjustment mechanism may be manually adjustable. In at least some embodiments, the orientation adjustment mechanism may be electronically controllable, in which case the adjustment mechanism for instance may comprise an electromotor or the like to automatically adjust the orientation of the luminaire 110 in accordance with a control signal provided to the electronically controllable orientation adjustment mechanism.

The luminaires 110 may be any suitable type of luminaire, e.g. a LED-based luminaire such as a LED-based flood light or the like.

The illumination system 100 further comprises a plurality of cameras 120, wherein each camera is associated with a luminaire 110 such that the camera 120 is arranged to capture an image of an illuminated part of the area 10 including the contribution to the illumination in the part of the area 10, i.e. the contribution to the overall illumination pattern on the area 10, generated by its associated luminaire 120.

The cameras 120 are typically arranged such that there exists a defined relationship between a field of view of the camera 120 and the optical axis of the associated luminaire 110. For example, the defined relationship between the field of view of the camera 120 and the optical axis of the luminaire 110 may be that the field of view of the camera 120 includes the optical axis of the luminaire such that the centre of the image captured by the camera 120 is the aiming spot or point of the associated luminaire 110. Preferably, the field of view of the camera 120 is such that the centre of an image captured by the camera 120 is the intersection of the optical axis of the associated luminaire 110 with respect to part of the area 10 at least in part illuminated by the illumination profile generated by the associated luminaire 110, i.e. the contribution of the associated luminaire 110 to the overall illumination pattern generated by the luminaires 110. It should however be understood that the defined relationship may include a known orientation or translation offset between the field of view of the camera 120 and the optical axis of its associated luminaire 110. Such an offset for instance may be present in a scenario where a camera 120 is associated with more than one luminaire 110, e.g. not directly mounted on a particular luminaire 110 but instead mounted in the vicinity of a cluster of luminaires 110, where a camera 120 is mounted on a particular luminaire 110 but arranged to capture the luminous profiles of more than one luminaire 110 aiming at the same part of the area 10, e.g. a wide-angle camera 120, and so on.

In an embodiment, each camera 120 is mounted on an associated luminaire 110, wherein the field of view of the camera 120 is aligned with a direction in which the associated luminaire 110 generates its contribution to the overall illumination pattern on the area 10. At this point it is noted that in some embodiments each luminaire 110 comprises or is associated with a camera 120. Alternatively, in some embodiments only a subset of the luminaires 110 comprise or are associated with a camera 120, such that the illumination system 100 comprises a mixture of luminaires 110, some of which are associated with a camera 120 and some of which are not. For example, in a scenario where positional/aiming information for the luminaires 110 is available and in which the cameras 120 can capture the region of the area 10 including the contribution to the overall illumination pattern by its associated luminaire 110 and at least part of the contributions of other luminaires, these other luminaires are not necessarily associated with a camera as the illumination pattern in the region of the area 10 captured by the camera 120 may be optimised without the need for further cameras. Instead, once the luminaire 110 associated with the camera 120 is correctly aimed, the remaining luminaires 110 for illuminating the region of the area 10 under observation of the camera 120 may be selected on the basis of the positional/aiming information, with their orientations fine-tuned using the optical feedback provided by the camera 120. This will be explained in further detail below.

A camera 120 may be any suitable camera or imaging means configured to capture an image and pass the image to the control unit 130, which will be explained in more detail below. For example, in some embodiments the camera 120 comprises lenses or optics to enable an adjustment of the field of view of the camera such as a zooming operation such that the camera is configured to capture a first image or set of images at a first zoom level with a wider field of view to enable coarse optimization of an illumination pattern of the area 10, and a second image or set of images at a second zoom level with a narrower field of view to enable fine tuning of such an illumination pattern. The camera 120 is not limited to a visible wavelength camera; any suitable type of camera, such as passive and active imaging devices, e.g. lidar devices, infra-red cameras, time-of-flight cameras, and so on, may be contemplated.

The illumination system 100 further comprises a control unit 130 communicatively coupled to the plurality of cameras 120 via communicative coupling 125, which may be any suitable coupling such as a wired or wireless coupling, which may include dedicated couplings between each camera 120 and the control unit 130 and/or may include a coupling shared between the cameras 120 and a control unit 130, such as a bus architecture or the like. Other suitable types of communicative couplings between the cameras 120 and the control unit 130 will be immediately apparent to the skilled person.

The luminaires 100 are typically positioned and aimed in accordance with a light plan, which may be stored in a data storage device 150 accessible to the control unit 130. Such a light plan for instance may include positional information and aiming information for each luminaire 110, e.g. a list or table of luminaires installed relative to the area 10, e.g. within a stadium or building, the type of luminaire, the mounting or placement location of the luminaires, which may be specified relative to a known reference point such as the centre point or spot of a stadium, the desired orientation of the luminaire, and the desired aiming point of the luminaire, which may be specified relative to the known reference point for instance.

As explained before, such a light plan is designed with the purpose to generate a particular luminous distribution, i.e. the predefined illumination pattern, over the area 10. Typically, the light plan gives an installer of the illumination system 100 installation guidance as where to position the individual luminaires 110 and how to aim the individual luminaires 110 towards a particular region of the area 10. Nevertheless, such a light plan does not necessarily achieve the desired luminous distribution across the area 10 for instance because the installer does not correctly follow the light plan, e.g. misdirects at least some of the luminaires 110 or for instance because the light plan is flawed, e.g. because some of the luminaires 110 cannot illuminate the intended part of the area 10 because of an unforeseen obstruction in the light path of the affected luminaire during the design of the light plan or because of the unavailability of an intended luminaire mounting position. The control unit 130 is typically adapted to receive an image from a camera 120 over the communicative coupling 125, which image typically comprises a part of the area 10 including the illumination contribution of the luminaire 110 associated with the camera 120 and to evaluate the actual illumination pattern over the part of the area 10 in the received image to determine a deviation from the predefined illumination pattern. Such a deviation for instance may be the result of an incorrect illumination of the monitored part of the area 10, which for instance may be the result of an incorrect light plan or an incorrect implementation of an otherwise correct light plan.

In some embodiments, the control unit 130 may employ an algorithm for evaluating a luminous distribution in the image captured by camera 120 and for comparing the evaluated luminous distribution with an intended luminous distribution of the predefined illumination pattern. For example, the control unit 130 may be adapted to perform a homogeneity evaluation of the luminous distribution in the image captured by camera 120 and compare the homogeneity of the luminous distribution against predefined homogeneity rules in order to determine if the illumination pattern in the part of the area 10 captured by the camera 120 conforms with these homogeneity rules, in case of the predefined luminous pattern being a homogeneous pattern.

If the control unit 130 determines that the luminous distribution in the captured image deviates from the predefined illumination pattern, this signals that the orientation of the luminaires 110 is sub-optimal and requires adjustment. The control unit 130 subsequently selects one of the luminaires 110 for orientation adjustment in order to adjust the aim of the selected luminaire 110 with the purpose of reducing or even cancelling the deviation of the actual illumination pattern in the part of the area 10 captured by the camera 120 from the predefined illumination pattern in this part of the area 10.

The control unit 130 subsequently generates an orientation adjustment signal for the selected luminaire 110 based on which the orientation of the selected luminaire 110 may be adjusted. The orientation adjustment signal may be a signal comprising the orientation adjustment information, which signal may be a control signal for a user interface such as a display unit or the like onto which the orientation adjustment information may be presented to an installer for manual adjustment of the selected luminaire 110 in accordance with the orientation adjustment information generated by the control unit 130. This may be an iterative procedure in which the control unit 130 receives an updated image of the part of the area 10 as captured by the camera 120 in which the manual adjustment of the selected luminaire 110 has been captured, with the control unit 130 evaluating the updated image as previously explained and generating an updated orientation adjustment signal in case the manual orientation adjustment of the selected luminaire 110 has not been perfectly executed, such that further orientation adjustment of the selected luminaire 110 may be required in order to reduce the deviation from the predefined illumination pattern in the monitored part of the area 10 below acceptable levels, e.g. cancel this deviation.

Alternatively, in case of a luminaire 110 comprising or being mounted on an electronically controllable orientation adjustment mechanism, the orientation adjustment signal may be a control signal for the electronically controllable orientation adjustment mechanism. In such an embodiment, each electronically controllable adjustment mechanism may be communicatively coupled to the control unit 130 through a communicative coupling 115, which may be any suitable coupling such as a wired or wireless coupling, which may include dedicated couplings between each electronically controllable orientation adjustment mechanism of a luminaire 110 and the control unit 130 and/or may include a coupling shared between controllable orientation adjustment mechanisms of the luminaires 110 and a control unit 130, such as a bus architecture or the like. Other suitable types of communicative couplings between the controllable orientation adjustment mechanisms of luminaires 110 and the control unit 130 will be immediately apparent to the skilled person.

In case of the control unit 130 having access to positional and aiming information for the luminaires 110, the control unit 130 may select an appropriate luminaire 110 for orientation adjustment based on this positional and aiming information, as for instance provided in the light plan. This will be explained in more detail below with the aid of FIG. 2.

Figure 2:
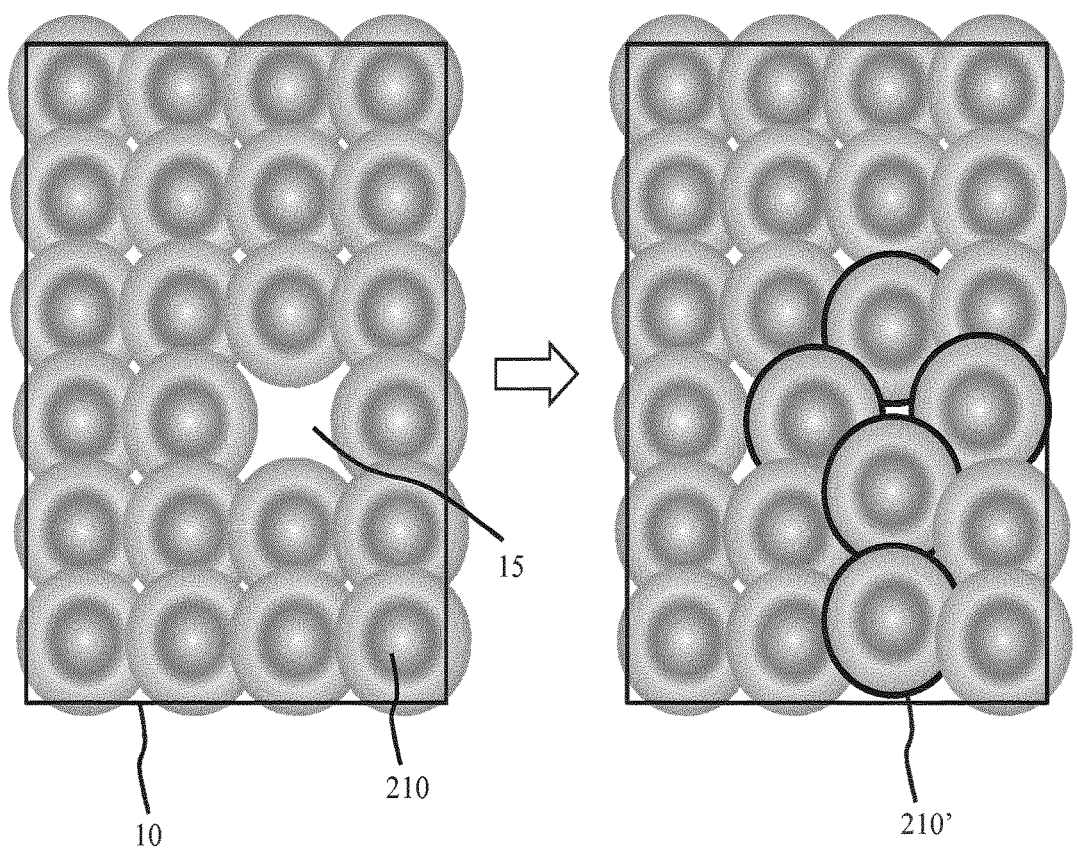
FIG. 2 schematically depicts an aspect of an operating principle of an illumination system according to an embodiment.

The left hand panel of FIG. 2 schematically depicts a situation that may arise from an incorrectly implemented light plan or a flawed light plan, wherein the luminous distributions 210 of the respective luminaires 110 are aimed at various locations on the area 10, but where a region 15 of the area 10 does not exhibit the desired or predefined illumination pattern, for instance due to a misaligned or suboptimal positioned luminaire 110 or the luminous output of a luminaire 110 being blocked by an obstruction in the light path of the luminaire 110. Such a region 15 for instance may be detected by systematic evaluation of the various regions of the area 10 using the images generated by the cameras 120 associated with the luminaires 110 and registering regions such as region 15 in which a deviation from the predefined illumination pattern is detected in that region. This for instance may be detected by a camera 120 associated with a luminaire 110 illuminating a portion of the area 10 adjacent to the misaligned or missing luminous distribution, where the control unit 130 for instance may detect the deviation by an incorrect or missing overlap between the luminous distribution 210 of the luminaire 110 associated with the camera 120 and the incorrectly aligned or missing adjacent luminous distribution 210. Alternatively, in case of a misaligned luminous distribution 210, i.e. a misaligned luminaire 110 generating this luminous distribution 210, the misalignment may be detected using the camera 120 associated with the misaligned luminaire 110.

Upon detecting such a deviation, the control unit 130 selects one or more luminaires 110 for compensating the detected deviation. To this end, the control unit 130 may access the light plan to identify luminaires 110 that are associated with the detected deviation, e.g. using the positional information and aiming information in the light plan to identify the luminaires 110 arranged to illuminate the region 15 or its direct vicinity. For example, where a camera 120 detects an illuminated region 15 exhibiting illumination characteristics that deviate from the predefined illumination pattern, this either signals that the luminaire 110 associated with the camera 120 is misaligned or that other luminaires 110 arranged to illuminate the region 15 are either misaligned or blocked. The control unit 130 may consult the light plan to identify the luminaires 110 associated with illuminating the region 15 and may generate orientation adjustment signals for the manual or electronic adjustment of the identified luminaires in order to reduce the determined deviation from the predefined illumination pattern in region 15 using the optical feedback provided by the cameras 120 associated with at least some of the identified luminaires 110 as previously explained. As schematically shown in the right hand panel of FIG. 2, this for instance may lead to the orientation readjustment of a number of the luminous distributions 210' produced by the luminaires 110 aimed at or near the region 15, here highlighted with a bold circle around the positional adjusted luminous distributions 210'.

In case of a blocked luminous distribution, e.g. by an unforeseen obstacle, the control unit 130 may be further adapted to generate an orientation adjustment signal for the blocked luminaire 110 until the camera 120 associated with the luminaire 110 captures an image of the luminous distribution produced by the luminaire 110 being projected onto the area 10. In this embodiment, the control unit 130 may attempt to overlap the luminous distribution of the affected luminaire with a luminous distribution already present in that part of the area 10, identify the luminaire 110 responsible for generating the already present luminous distribution and generate an orientation adjustment signal for the latter luminaire such that this luminaire is re-aimed at the portion of the area 10 or originally intended to be illuminated by the blocked luminaire. In this manner, it is ensured that all luminaires 110 of the illumination system 100 produce a luminous distribution that is used for illuminating the area 10, thus optimizing the likelihood of the illumination system 100 achieving the predefined illumination pattern across the area 10.

Several variations to the above will be apparent to the skilled person. For example, the control unit 130 may consult association information identifying each luminaire 110 associated with a particular camera 120, wherein the control unit 130 is adapted to select the luminaire 110 associated with the determined deviation based on the information contained in the light plan and the association information. Such association information may be stored in any suitable data storage device, e.g. a memory or the like, which may be the data storage device 150 storing the light plan or may be a different data storage device.

It is furthermore noted that the embodiments of the present invention have been described in terms of attempting to reduce or cancel out an observed deviation based on optical feedback provided by the cameras 120 from a predefined illumination pattern across the area 10 by means of luminaire orientation readjustment signals generated by the control unit 130 in response to this optical feedback. It should however be understood that in addition to such luminaire reorientation signals, the control unit 130 may be further adapted to adjust the light intensity of the selected luminaires 110, e.g. by dimming, in order to achieve the predefined illumination pattern across the area 10.

Figure 3:
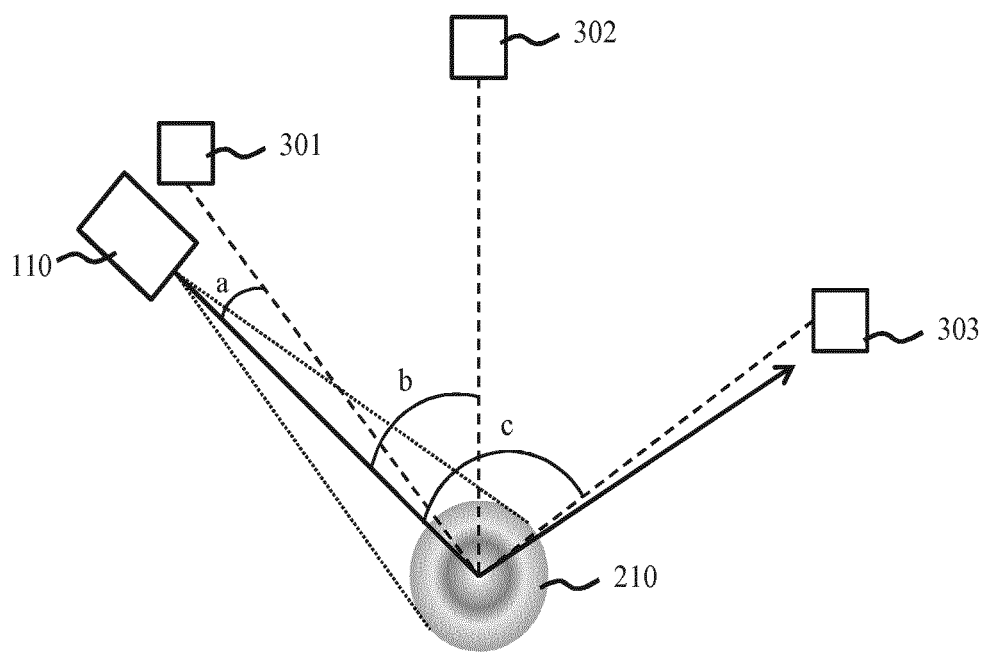
FIG. 3 schematically depicts an illumination principle of an illumination system.

In an embodiment, the area 10 may need to exhibit the predefined illumination profile from various viewing angles, for instance in the case of the area 10 being observed by TV cameras along these viewing angles, e.g. in the case of the area 10 being a pitch or the like of a sports arena. It is noted that it is not guaranteed that when establishing the predefined illumination profile along a single viewing angle, the illumination profile along different viewing angles also exhibits the desired illumination characteristics. As will be readily understood by the skilled person, the light intensity perceived along a particular viewing angle, e.g. along the viewing angle of a camera 120, is a function of the various angles under which a part of the area 10 under observation is illuminated. This will be explained in more detail with the aid of FIG. 3.

Where a luminaire 110 generates a luminous distribution 210, the intensity of this luminous distribution 210 will be perceived differently under different viewing angles, here labelled a-c for respective observers 301-303, e.g. different cameras. For observer 301, the viewing angle a with the optical axis of the luminaire 110 is close to 0°, which means that the observer 301 will mainly observe scattered light from the luminous distribution 210. For observer 302 the viewing angle b with the optical axis of the luminaire 110 is increased, such that the observer 302 will observe scattered light as well as reflected light from the luminous distribution 210, thus perceiving a more intense luminous distribution than observer 301. For observer 303 the viewing angle c with the optical axis of the luminaire 110 is yet further increased, such that the observer 303 is in the main reflection direction (as indicated by the solid arrow) of the luminous distribution 210 and observer 303 will observe a particularly intense luminous distribution 210.

This is typically mitigated by illumination the same part of the area 10 by multiple luminaires 110 from various angles such that the angular dependence of the perceived light distribution is minimized.

Consequently, when optimizing the illumination profile over the area 10 using cameras 120 (substantially) aligned with the optical axes of the luminaires 110 with which the cameras 120 are associated, this may not necessarily lead to the achievement of the predefined illumination pattern along all viewing angles of interest, such as viewing angles along which TV cameras may be placed, as such viewing angles may be substantially different to the angles under which the cameras 120 observe the area 10. For example, the cameras 120 may be associated with luminaires 110 at a first height above the area 10 whereas the observers 301-303 may observe the area 10 from a different height, e.g. below overhead luminaires 110.

Figure 4:
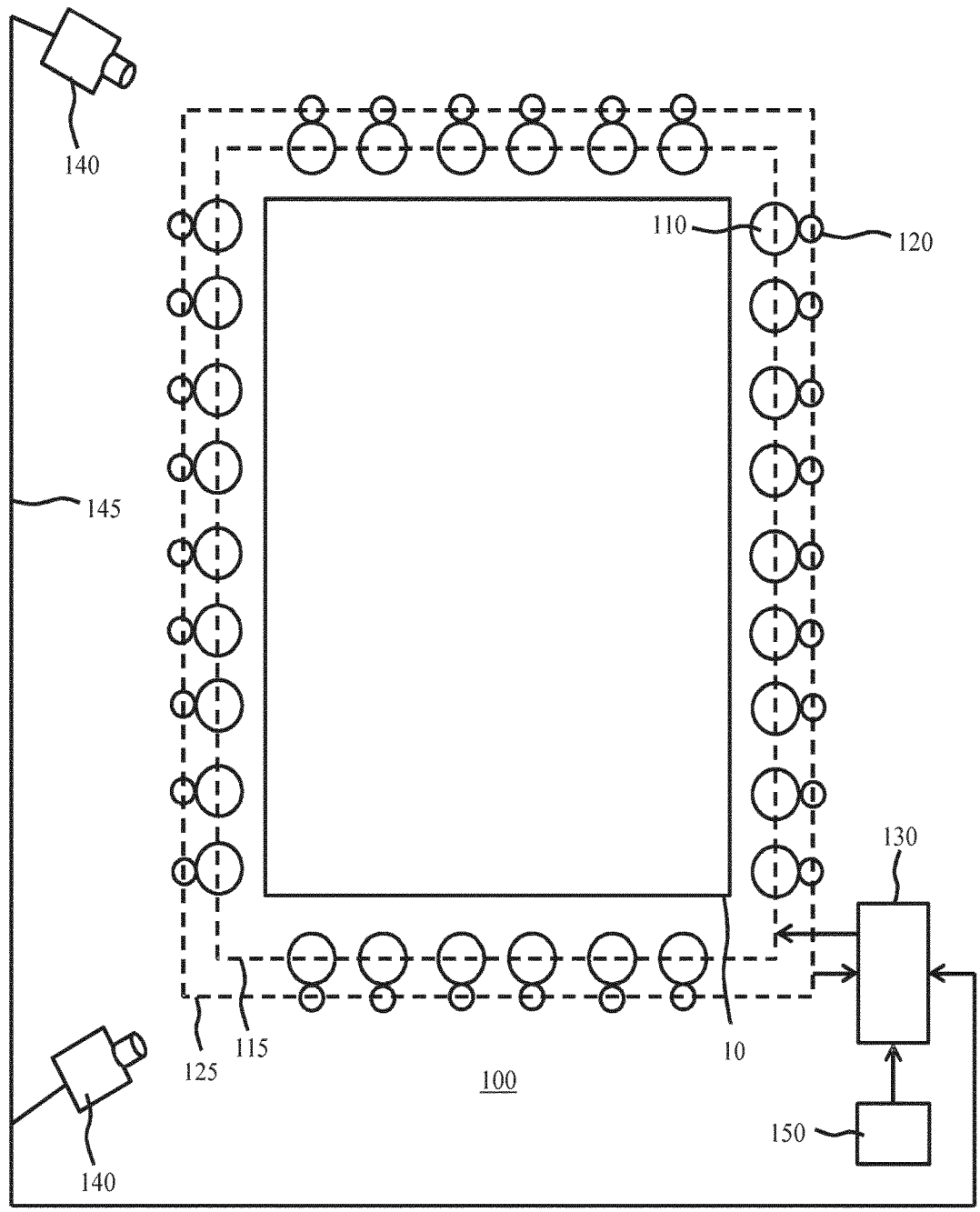
FIG. 4 schematically depicts an illumination system according to another embodiment.

FIG. 4 schematically depicts an embodiment of an illumination system 100 that may assist in addressing this issue. In this embodiment, the illumination system 100 further comprises one or more further cameras 140 placed along the viewing angles of interest and communicatively coupled to the control unit 130 via communicative coupling 145, which may be any suitable coupling such as a wired or wireless coupling, which may include dedicated couplings between each further camera 140 and the control unit 130 and/or may include a coupling shared between further cameras 140 and a control unit 130, such as a bus architecture or the like. Other suitable types of communicative couplings between the further cameras 140 and the control unit 130 will be immediately apparent to the skilled person.

In this embodiment, the control unit 130 is adapted to generate the orientation adjustment signal for a selected luminaire 110 based on the optical feedback provided by a camera 120 associated with the selected luminaire 110 or a previously selected luminaire as explained in more detail above as well as on the optical feedback provided by the one or more further cameras 140. For example, the control unit 130 may be adapted to solve a set of linear equations each trying to minimise the observed deviation from the predefined illumination pattern, e.g. a deviation from a minimum degree of homogeneity to be achieved in the observed illumination pattern along the viewing angle associated with the linear equation; in other words, each linear equation is associated with the image data provided by one of the cameras 120 or by one of the further cameras 140. As before, this may be an iterative process in which the control unit 130 generates updated orientation adjustment signals for the selected luminaire 110 based on updated images generated by the one or more cameras 120 and the one or more further cameras 140.

In an embodiment, the control unit 130 is configured to restrict the number of iterations of the luminaire orientation adjustment. If the selected luminaire 110 cannot be adjusted (either manually or automatically as previously explained) within the set number of iterations such that the deviation from the predefined illumination pattern along the viewing angles of interest can be reduced to below an acceptable threshold or cancelled, the control unit 130 may reject the selected luminaire 110 and may instead select another luminaire 110 from the plurality of luminaires and repeat the optimization process for the newly selected luminaire 110.

This for instance may be used to solve problems with misplaced luminaires 110 or luminaires 110 that cannot illuminate the intended part of the area 10 as specified in the light plan due to unforeseen objects, e.g. constructional features, blocking the light path of the luminaire 110 to this part of the area.

Figure 5:
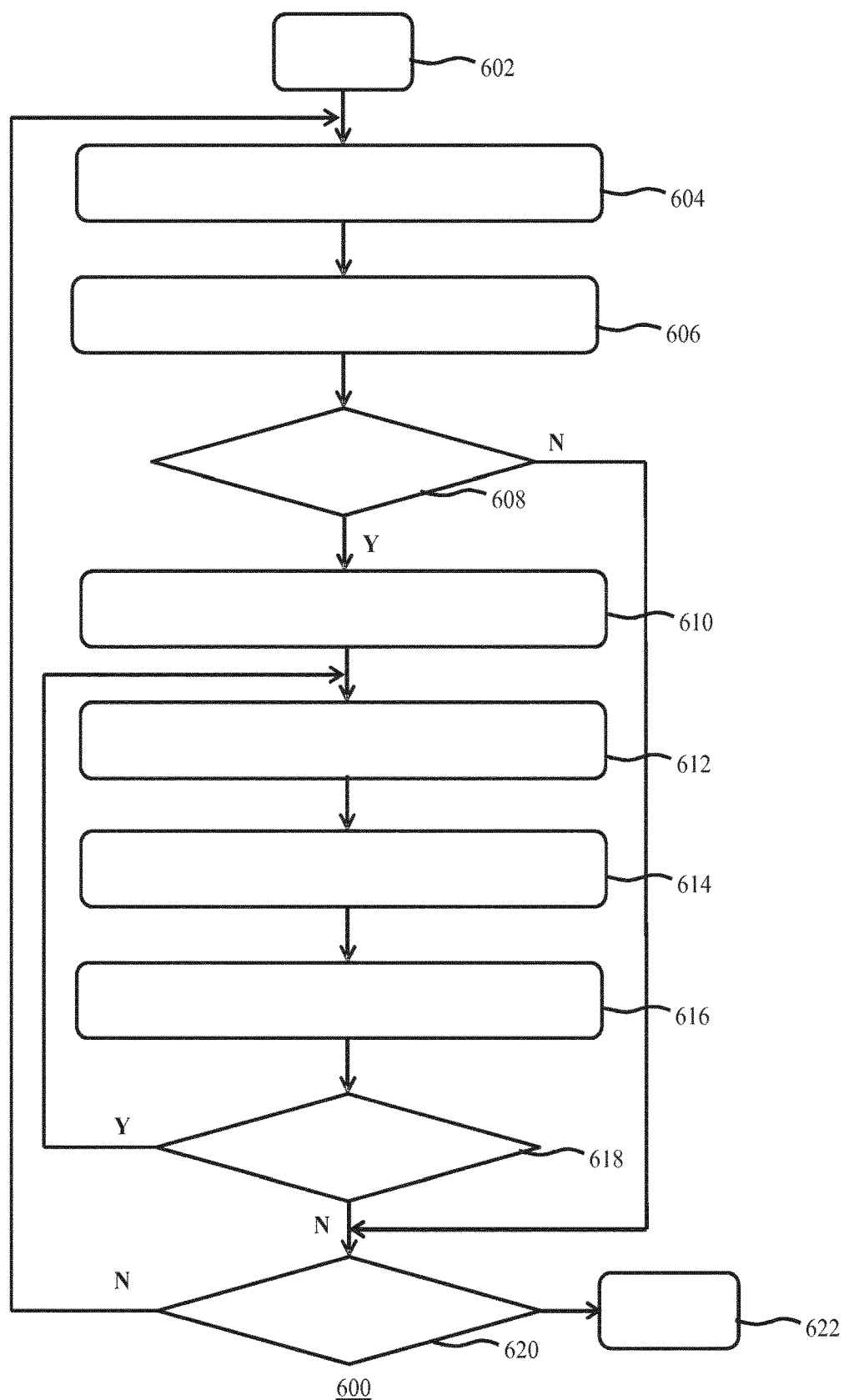
FIG. 5 depicts a flow chart of a method of generating a predefined illumination pattern on an area of given size according to an embodiment.

FIG. 5 is a flow chart of an example embodiment of a method 600 for generating a predefined illumination pattern on an area 10 of given size with a plurality of luminaires 110 each comprising an adjustable orientation mechanism and being arranged to generate a contribution to said illumination pattern on a part of said area. The method 600 typically is a computer-implemented method 600 comprising computer program code stored on a computer-readable medium, which computer program code for instance may be executed on a processor of an illumination system 100, e.g. a processor incorporated in the control unit 130. Embodiments of the method 600 seek to systematically evaluate the illumination distribution across an area 10 of given size using optical feedback provided by the cameras 120 associated with at least some of the luminaires 110 as explained in more detail above.

The method 600 may start in 602, e.g. with the installation of the luminaires 110 and associated cameras 120 and the approximate aiming of the luminaires 110 at respective regions of the area 10, as per a predesigned light plan as previously explained. Next, one of the cameras 120 is selected in step 604, e.g. based on light plan information, and an image of an illuminated part of the area 10 is captured with the selected camera 120.

The captured image is subsequently evaluated in step 606, e.g. by the control unit 130, for instance by evaluating the luminous distribution across the captured image and comparing the luminous distribution across the captured image with the target luminous distribution of the predefined illumination pattern for the region of the area 10 under evaluation. In step 608, the control unit 130 decides if the luminous distribution across the captured image deviates from the target luminous distribution of the predefined illumination pattern for the region of the area 10 under evaluation to such an extent, e.g. exceeding a predefined threshold, that orientation adjustment of some of the luminaires 110 is required to compensate for this deviation. If no deviation is detected, the method 600 progresses to step 620 in which it is checked if the preferred illumination pattern has been confirmed over the whole area 10. If this is not the case, the method reverts back to step 604 in which an image of the luminous distribution of another region of the area 10 is captured using another one of the cameras 120. Otherwise, the method 600 terminates in step 622.

If on the other hand it is decided in step 608 that orientation adjustment of some of the luminaires 110 is required to compensate for the detected deviation, the method 600 proceeds to step 610 in which the luminaire 110 to be adjusted is selected. For the avoidance of doubt, it is reiterated that such a deviation may be the result of an incorrect or incorrectly implemented light plan as for instance explained in more detail with the aid of FIG. 2. As previously explained, the selected luminaire 110 may be the luminaire 110 associated with the camera 120 used to capture the image on which the deviation evaluation has been based, e.g. a misaligned luminaire 110, a luminaire 110 randomly selected from the pool of luminaires 110 not yet aligned or a luminaire 110 selected based on position/aiming information in a light plan, potentially supplemented by a selection process based on association information of the association of the luminaire 110 to be selected with a particular camera 120.

In step 612, the control unit 130 generates orientation adjustment signal for the selected luminaire 110, which orientation adjustment signal is typically generated on the basis of the performed evaluation of the captured image and the deviation from the predefined illumination pattern detected in the captured image. As previously explained, the orientation adjustment signal may be to provide an installer with instructions to manually adjust the selected luminaire 110 or in a particularly advantageous embodiment may be a control signal to automatically adjust the orientation of the selected luminaire 110 by controlling the electronically controllable orientation adjustment mechanism of the luminaire 110.

The effect of the reorientation of the selected luminaire 110 may be monitored in step 614 by capturing an updated image of the illuminated region of the area 10 comprising the previously detected deviation from the predefined illumination pattern, which updated image may be captured by the camera 120 associated with the selected luminaire 110 or with a camera 120 associated with a previously selected luminaire 110 generating a luminous distribution 210 to be partially overlapped with the luminous distribution 210' of the presently selected luminaire 110, which updated image may be evaluated in step 616 by the control unit 130 to determine if the deviation from the predefined illumination pattern in the region under investigation of the area 10 is reduced. If such a deviation is still present, the control unit 130 may decide in step 618 to generate an updated orientation adjustment signal for the selected luminaire 110, in which case the method 600 refers back to step 612. In this manner, a feedback loop is provided in which the images captured by the camera 120 are used as optical feedback to control the adjustment of the orientation of the selected luminaire 110 in order to achieve the predefined illumination pattern across the region under investigation of the area 10. If on the other hand it is decided in step 618 that no significant deviation from the predefined illumination pattern is present in the updated image, the method 600 may progress to the previously explained step 620.

At this point, it is noted that although not explicitly shown in FIG. 6, the method 600 may further evaluate in step 618 or in any other suitable step if the number of iterations to reduce a detected deviation from the predefined illumination pattern has reached a predefined threshold. If this is the case, the method 600 may decide that it is not possible to sufficiently reduce the detected deviation from the predefined illumination pattern with the selected luminaire 110, in which case the method 600 may be referred back to step 610 in which another luminaire 110 is selected for orientation adjustment in order to reduce the detected deviation from the predefined illumination pattern. This for instance may be the case if the control unit 130 cannot achieve an adjustment of a previously selected luminaire 110 such that the predefined illumination pattern is achieved along multiple viewing angles, as for instance explained in more detail with the aid of FIG. 3.

The embodiments described herein may be implemented by computer software executable by a data processor of the apparatus, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

The software may be stored on such physical media, i.e. computer-readable media, as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments as discussed herein may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An illumination system for generating a predefined illumination pattern on an area, the system comprising:
    a plurality of luminaires, each luminaire having an orientation adjustment mechanism and being arranged to generate a contribution to said predefined illumination pattern on a part of said area;
    a plurality of cameras, each camera associated with at least one of said luminaires for capturing an image of an illuminated part of said area including the contribution generated by said associated luminaire;
    a data storage device storing a light plan including positional information and aiming information for each luminaire; and
    a control unit adapted to facilitate the generation of the predefined illumination pattern by:
    evaluating one of said images to determine a deviation from the predefined illumination pattern for the illuminated part of said area captured in said image;
    selecting a luminaire from said plurality of luminaires based on information contained in said light plan; and
    generating an orientation adjustment signal for the selected luminaire based on the determined deviation.

2. The illumination system of claim 1, wherein the orientation adjustment mechanism is an electronically controllable orientation adjustment mechanism, and wherein the orientation adjustment signal is for controlling the electronically controllable orientation adjustment mechanism.

3. The illumination system of claim 1, wherein the control unit is adapted to:
    select a first luminaire of said plurality and generate the orientation adjustment signal for the first luminaire to align the contribution to the illumination pattern generated by the first luminaire with a reference point on said area based on the image captured by the camera associated with the first luminaire; and
    repeatedly select a subsequent luminaire of said plurality and generate the orientation adjustment signal for the subsequent luminaire to align the contribution to the illumination pattern generated by the subsequent luminaire with a contribution to the illumination pattern generated by a previously selected luminaire based on the image captured by at least one of (a) the camera associated with the subsequent luminaire, and (b) the camera associated with the previously selected luminaire, until the predefined illumination pattern has been established.

4. The illumination system of claim 1, further comprising a plurality of further cameras for positioning along different viewing angles of the area, each of the further cameras being arranged to capture a further image of at least a part of the illumination pattern along its viewing angle, wherein the control unit is adapted to facilitate the generation of the predefined illumination pattern by selecting a luminaire and generate the orientation adjustment signal for the selected luminaire in response to:
    illumination pattern information extracted from an image captured by the camera associated with the selected luminaire; and
    illumination pattern information extracted from respective images captured by the further cameras.

5. The system of claim 1, further comprising a data storage device storing association information identifying each luminaire associated with a particular camera, wherein the control unit is adapted to select the luminaire associated with the determined deviation based on the information contained in the light plan and the association information.

6. The illumination system of claim 1, wherein the light plan further contains orientation information for each luminaire, and wherein the control unit is adapted to generate the orientation adjustment signal for the selected luminaire from its orientation information in the light plan and to optionally update the orientation information of the selected luminaire in accordance with the generated orientation adjustment signal.

7. The illumination system of claim 1, wherein the control unit is adapted to iteratively:
    receive and evaluate an updated image of said illuminated part for determining an updated deviation from the predefined illumination pattern following an orientation adjustment of the selected luminaire; and
    generate a further orientation adjustment signal for the selected luminaire in order to reduce the updated deviation until said updated deviation falls below a predefined deviation threshold or until the number of iterations exceeds a predefined iteration threshold.

8. The illumination system of claim 1, wherein the control unit is further adapted to adjust the intensity of the contribution to the illumination pattern generated by the selected luminaire to achieve the predefined illumination pattern.

9. The illumination system of claim 1, wherein each luminaire comprises a camera mounted on the luminaire and wherein a field of view of said camera is aligned with a direction in which the associated luminaire generates its contribution.

10. The illumination system of claim 1, wherein each camera is associated with more than one luminaire.

11. The illumination system of claim 1, wherein said illuminated part is illuminated by a plurality of said contributions, wherein said contributions are partially overlapping in said predefined illumination pattern.

12. The illumination system of 1, wherein the control unit employs an algorithm for:
    evaluating a luminous distribution captured in said image; and
    comparing the evaluated luminous distribution with an intended luminous distribution of the predefined illumination pattern,
    wherein the control unit is adapted to generate the orientation adjustment signal based on said comparison.

13. The illumination system of claim 1, wherein the area is one of a pitch of a stadium, a building façade, a floor area of a commercial building or a parking area.

14. The illumination system of claim 1, wherein the predefined illumination pattern is a homogeneous illumination pattern.

15. A computer-implemented method for generating a predefined illumination pattern on an area with a plurality of luminaires each comprising an adjustable orientation mechanism and being arranged to generate a contribution to said illumination pattern on a part of said area, the method comprising the steps of:
    capturing an image of an illuminated part of said area including the contribution generated by said associated luminaire;
    evaluating said image to determine a deviation from the predefined illumination pattern for the illuminated part of said area captured in said image;
    selecting a luminaire from said plurality of luminaires based on information in a light plan including positional information and aiming information for each luminaire; and
    generating an orientation adjustment signal for the selected luminaire based on the determined deviation.

* * * * *